(12) United States Patent
Liao et al.

(10) Patent No.: US 6,657,136 B1
(45) Date of Patent: Dec. 2, 2003

(54) TERMINATION BOARD FOR MOUNTING ON CIRCUIT BOARD

(75) Inventors: Peter Liao, Santa Rose, CA (US); Zsolt G. Takacs, Sonoma, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/608,528

(22) Filed: Jun. 30, 2000

(51) Int. Cl.[7] .................................................. H05K 1/11
(52) U.S. Cl. ..................... 174/267; 174/260; 361/738; 361/767; 361/803; 257/724
(58) Field of Search ................. 174/260, 267; 361/738, 767, 784, 790–795, 803; 257/724

(56) References Cited

U.S. PATENT DOCUMENTS

| | | | |
|---|---|---|---|
| 4,636,918 A | 1/1987 | Jodoin | 361/405 |
| 4,682,207 A | 7/1987 | Akasaki et al. | 357/74 |
| 4,811,082 A | 3/1989 | Jacobs et al. | 357/80 |
| 5,010,641 A | 4/1991 | Sisler | 29/830 |
| 5,255,431 A * | 10/1993 | Burdick | 29/840 |
| 5,774,326 A | 6/1998 | McConnelee et al. | |
| 5,926,375 A | 7/1999 | Watanabe et al. | 361/760 |
| 5,953,214 A * | 9/1999 | Dranchak et al. | 361/767 |
| 5,982,635 A * | 11/1999 | Menzies et al. | 361/790 |
| 6,004,657 A * | 12/1999 | Moriyasu et al. | 428/210 |
| 6,021,050 A * | 2/2000 | Ehman et al. | 361/793 |
| 6,031,728 A * | 2/2000 | Bedos et al. | 361/767 |
| 6,169,663 B1 * | 1/2001 | Garcia | 361/760 |

OTHER PUBLICATIONS

MicroStar BGA Packaging Reference Guide, copyright 1999, Texas Instruments Incorporated; pp. i–vi and 1–1.
*Presenting the ACC Trhee Musketeers*; ACHEM Technology Inc.; May 11, 1999.
*The T–1am System*, Thermagon, Inc.

* cited by examiner

*Primary Examiner*—David L. Talbott
*Assistant Examiner*—Jose H. Alcala
(74) *Attorney, Agent, or Firm*—Campbell Stephenson Ascolese LLP

(57) ABSTRACT

Terminating resistances are provided to at least some pins of an ASIC or other multi-pin component mounted on a surface of a circuit board, by positioning a second circuit board on the surface of the main circuit board substantially opposite, and preferably aligned with or overlapping, the multi-pin component. The second circuit board accommodates a resistor such as a printed resistor, surface mount resistor or buried resistor. Preferably, vias in the main circuit board connect pins of the ASIC to terminating resistors. Preferably one or both of the ASIC and the second circuit board are coupled to the main circuit board by a ball grid array.

13 Claims, 4 Drawing Sheets

TERMINATION BOARD FOR MOUNTING ON CIRCUIT BOARD

Cross-reference is made to U.S. patent application Ser. No. 09/481,139, filed Jan. 11, 2000, incorporated herein by reference.

The present invention is directed to a method and apparatus for providing effective and inexpensive termination to one or more pins of an electronic device and in particular to a board, for providing termination, which is mountable to a main circuit board.

BACKGROUND INFORMATION

A number of electronic devices incorporate one or more circuit boards which have multiple-pin units coupled thereto. Recent trends have been toward providing relatively high pin densities such as units with 1100 or more pins within a mounting surface area or "footprint" as small as 1600 $mm^2$. In many electronic devices, particularly digital devices, at least some of the pins are "terminated", i.e., coupled to a termination resistance. Termination can assist in providing a well-defined environment within which digital signals can travel, so that signal levels will correspond to established values of "high" and "low". Termination of a given signal can be used to absorb energy of an incoming signal. Receiver circuitry typically senses the voltage on the terminating resistor.

A number of types of components fall in this category, including, for example, application specific integrated circuits (ASICs). ASICs and similar components can be mounted to a circuit board, providing desired electronic connections, in any of a number of fashions. One fashion of making such couplings is providing an ASIC (or similar component) with a pattern of solder balls (a "ball grid array") such that the (relatively dense) pins of the ASIC or similar device can be readily coupled to an array of printed circuit pads or other components on the circuit board, e.g., using a single heating step.

In many situations, it can be infeasible to provide terminations for pins within the footprint of the component, especially for high-pin density devices. Accordingly, previous devices have typically provided short (e.g., printed circuit) conductive leads or "stubs" leading away from pin pad locations within the footprint, to another region of the board where a termination resistor can be placed. Terminating resistors can include surface mount resistors (typically provided using a "pick and place" procedure) and/or buried resistors (at least partially formed as an interior region or layer of the circuit board).

There are a number of undesirable effects associated with previous approaches. In general, it would be more advantageous to place termination resistors as close to the respective pins as possible. For example, the leads or stubs can create an amount of parasitic inductance. Termination resistors which are significantly spaced from a corresponding pin can result in distorting signals by creating reflections. Short leads or stubs can effectively act as small antenna, creating distortions and/or undesirable electromagnetic interference (EMI). These and other undesirable effects are especially aggravated in devices or components with high (clock) frequencies, of the type becoming increasing common, such as frequencies of one gigahertz or more. As a result, prior approaches, including as described above, while they might have been suitable for earlier, lower frequency, lower pin-density devices, are becoming increasingly unacceptable in the context of modem high frequency electronic devices.

Accordingly, it would be useful to provide a system, method and apparatus for terminating desired pins of an ASIC or similar board-mounted device which can reduce or eliminate undesirable features of prior approaches, including as described above (such as undesirable signal distortion, reflectance, EMI and the like), especially in the context of high frequency electronic devices and/or high pin-density components.

Another disadvantage associated with the previous approaches has been the cost for implementing such approaches. The approach of placing termination resistances outside the footprint of an ASIC (or similar device) requires an undesirably large expenditure in pick and place procedures (e.g. in the case of surface mount resistors). When buried resistances are used, the cost of fabricating the circuit board can be relatively high including the cost of fabricating a circuit board having multiple layers (even though, for termination purposes, additional layers may be needed, only over a small region of the main circuit board) approaches which involve positioning termination resistance outside the footprint of the ASIC (or similar component) consumes some of the region or surface area of the circuit board, which can ultimately add to the cost of the electronic device.

In general, if an electronic device is being redesigned or modified to use a different ASIC, (e.g., having different pin positions requiring termination), previous approaches would require redesigning the main circuit board (even in situations where these are substantially the only changes being made). This approach, in addition to adding to the average design costs for a line of electronic devices, also creates other costs, such as costs of fabricating, warehousing, distributing and tracking multiple different main circuit boards, to accommodate different ASICs, costs of training personnel in analyzing or maintaining multiple different versions of the main circuit board and the like.

Accordingly, it would be useful to provide a system, method and apparatus which can be readily configured to provide desired terminations for component pins, while reducing costs associated with previous approaches.

SUMMARY OF THE INVENTION

The present invention includes a recognition of the existence, source and/or nature of problems in previous approaches, including as described herein.

In one aspect, the present invention involves positioning a second, preferably smaller, circuit board ("termination board") which can include or accommodate termination resistances (e.g., surface mount resistors, printed resistors or buried resistors), mounted on the circuit board which contains the ASIC ("the main" circuit board), with the ASIC (or similar component) and termination board being positioned on opposite sides of the main circuit board. The termination board is preferably fully or partially aligned with, overlapping with, or substantially in the vicinity of the ASIC footprint. In one embodiment, both the ASIC and the termination board are ball grid array devices (BGA). Through-holes or "vias" in the main circuit board provide a conductive signal pathway from at least some ASIC pins, through the main circuit board, to pads, vias and the like, of the termination board, and preferably the termination board ball grid array at least partially corresponds to the positions of the vias. In this way, the termination resistance is provided in, or on, the termination board. Resistances can be positioned substantially within the footprint of the ASIC, preferably substantially aligned with a corresponding ASIC pin and spaced about the combined thickness of the main circuit board and the thickness of the termination board, from the corresponding pin of the ASIC. This approach can be used to eliminate some or all stubs and/or reduce the number and/or length of stubs. As a result, the amount of signal distortion, reflections, and/or EMI can be reduced, which can be of particular benefit in the context of high frequency devices.

By providing some or all termination resistances within the footprint of the ASIC, a number of costs savings are possible. Surface area within the ASIC footprint can be put to use reducing or eliminating the amount of main circuit board non-footprint area consumed by termination resistors. In at least some circumstances, use of a new or modified ASIC, or other circuit modifications can be accommodated by designing and using a new termination board, thus reducing or eliminating the amount of redesign needed on the main circuit board. Economies of scale associated with placing surface mount resistors (if used) on (relatively small) termination boards can reduce pick and place costs associated with the main circuit board and/or the electronic device as a whole.

In some aspects, the termination board may be configured such that it does not cover the entire footprint of the ASIC. For example, in some situations those ASIC pins which require termination (or which will be terminated by a connection with the termination board) are positioned in only a portion of the full ASIC footprint, and thus the termination board, in this embodiment, may cover only that portion of the ASIC footprint. In some embodiments, the termination board may have at least a portion which is positioned outside the ASIC footprint, e.g., to provide communications between external signals (external to the ASIC) and the termination BGA, or one or more ASIC pins.

In one aspect terminating resistances are provided to at least some pins of an ASIC or other multi-pin component mounted on a surface of a circuit board, by positioning a second circuit board on the surface of the main circuit board substantially opposite, and preferably aligned with or overlapping, the multi-pin component. The second circuit board accommodates a resistor such as a printed resistor, surface mount resistor or buried resistor. Preferably, vias in the main circuit board connect pins of the ASIC to terminating resistors. Preferably one or both of the ASIC and the second circuit board are coupled to the main circuit board by a ball grid array.

DETAILED DESCRIPTION OF THE PREFERRED EMBODIMENT

Figure 1:
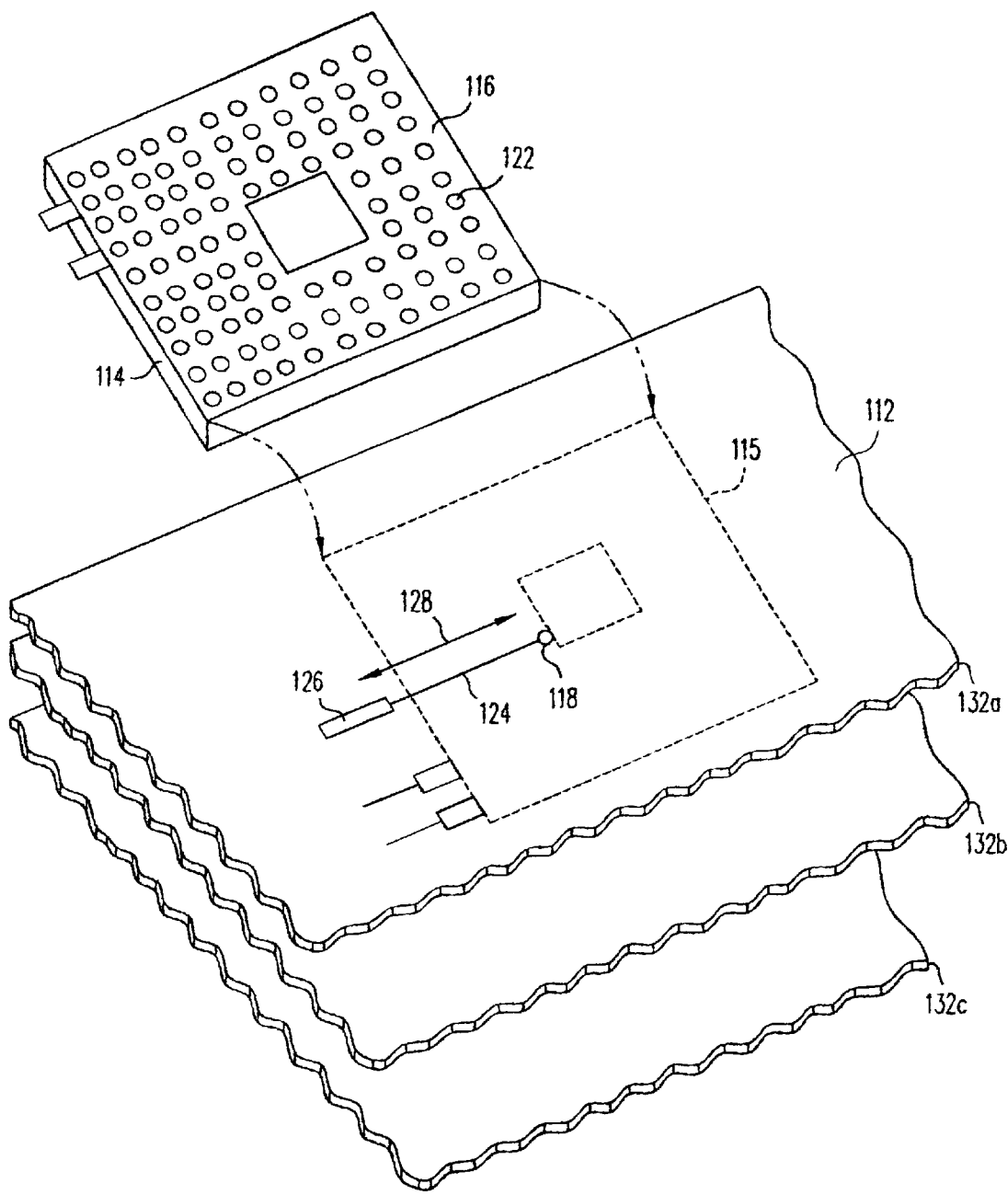
FIG. 1 is a perspective, partially exploded, partially cutaway view of an ASIC mounting to a printed circuit board, according to previous approaches.

As depicted in FIG. 1, in previous devices a circuit board 112 may have one or more multiple-pin ASICs 114 or similar multi-pin devices mounted thereon. Defining a footprint 115 of the ASIC on the circuit board 112. In many common previous approaches, the underside 116 of the ASIC 114 is provided with an array of solder balls corresponding to ASIC signal, power, ground or other pins. In mounting, the ASIC is positioned such that the solder balls and/or pins are aligned with corresponding pads or the like (only one of which 118 is depicted in FIG. 1). The pads 118 can be provided with printed wires or traces to achieve the desired signal routing, or other electronic connections. In many devices, the array of pins and/or solder balls 122 is relatively dense (such as 1100 or more pins in an area of 1600 mm$^2$). In many situations, the ball array or pin array is so dense that it is infeasible to position termination resistors within the ASIC footprint 115. In many previous approaches, a printed wire or other lead 124 is provided to connect a pad 118 (coupled to a pin of the ASIC 114), to a termination rsistor 126 which may be positioned outside the footprint 115 and thus may provide a stub having a length 128 sufficiently great to create undesirable effects such as reflection, signal distortion, EMI and the like. These undesirable effects can reach intolerable magnitudes, especially when the ASIC 114 is a high frequency device such as a device with a clock frequency of 1 gigahertz or more.

In some previous approaches, some or all termination resistors were provided as buried resistors, which commonly involves fabricating a circuit board 112 having multiple layers 132a,b,c, undesirably increasing the expenses associated with the circuit board 112.

Figure 2:
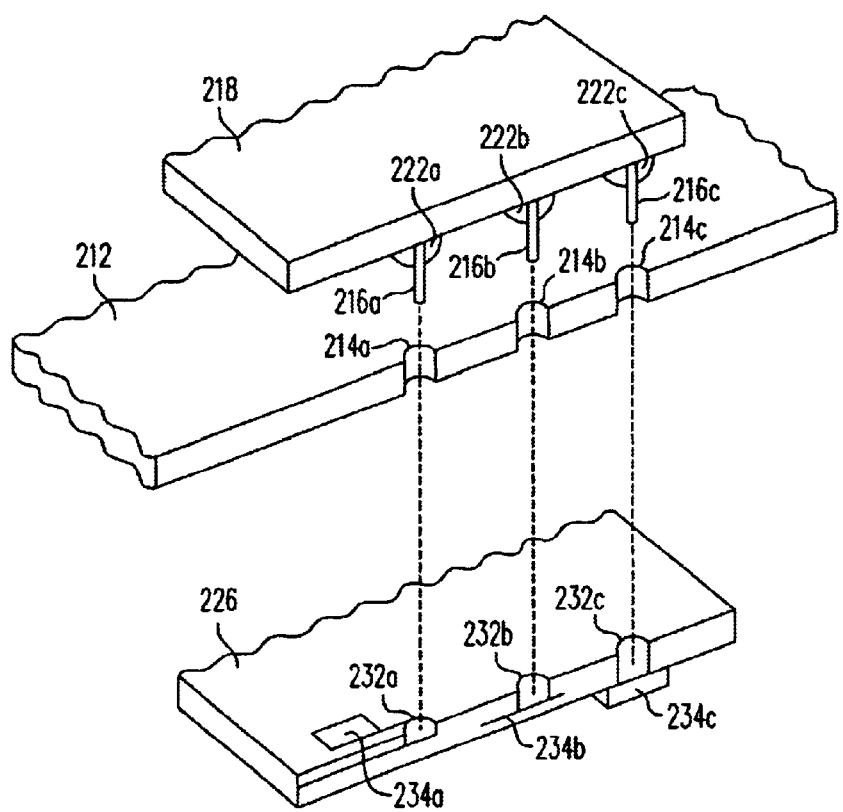
FIG. 2 is an exploded, perspective, partially broken-away view of a termination board mounted to a main board opposite an ASIC.
Figure 4:
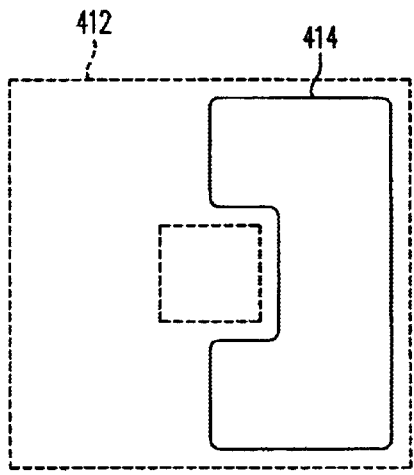
FIG. 4 is a top plan view of a termination board showing positional relationship with respect to an ASIC footprint, shown in phantom, according to an embodiment of the present invention.
Figure 5:
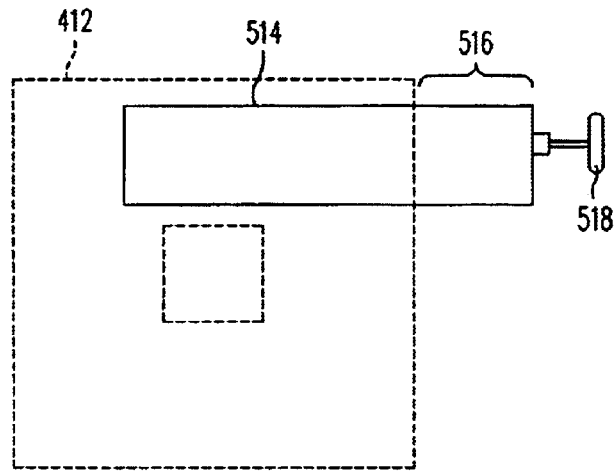
FIG. 5 is a top plan view of a termination board showing a positional relationship to a ASIC footprint (shown in phantom) according to an embodiment of the present invention.

In the embodiment depicted in FIG. 2, the circuit board 212 is provided with a plurality of through-holes or vias 214a,b,c with corresponding pins 216a,b,c of an ASIC 218 extending substantially therethrough. Although the embodiment of FIG. 2 provides for ASIC pins 216a,b,c extending through vias 214a,b,c, it is also possible to provide vias which are filled or lined with conductive material and, in these embodiments, the pins 216a,b,c would only need to contact the conductive material of the vias.

Figure 3:
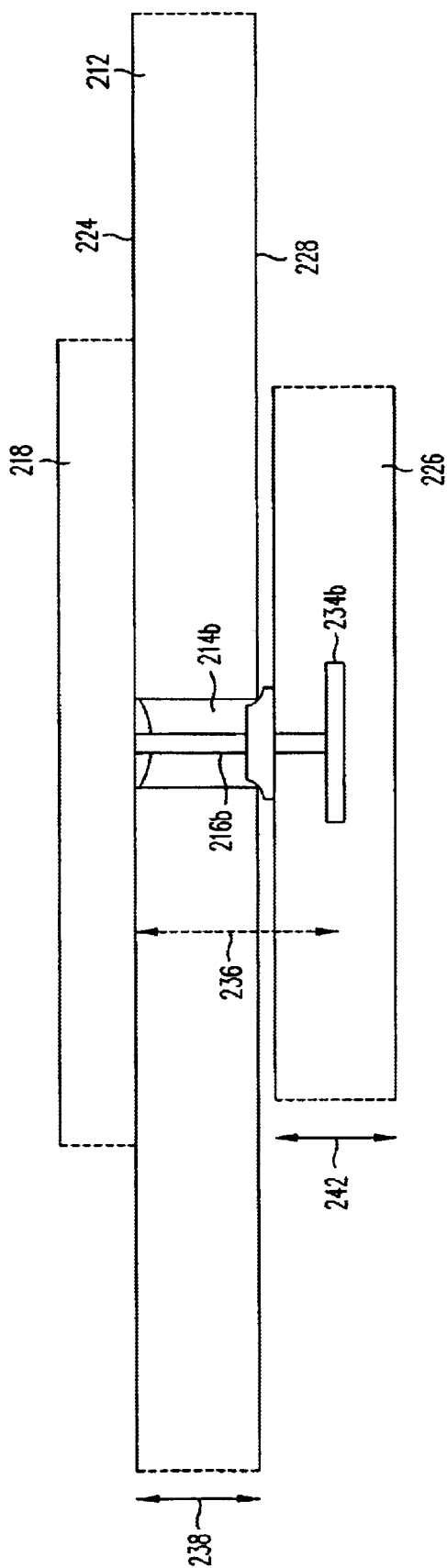
FIG. 3 is a partial cross-sectional view of a termination board mounted to a main circuit board opposite an ASIC, according to an embodiment of the present invention.

Some or all pins are associated with solder balls 222a,b,c used in mounting the ASIC 218 to the circuit board 212, as will be understood by those of skill in the art. As seen in FIG. 3, the ASIC 218 is mounted on a first surface 224 of the circuit board 212. A termination board 226 is mounted on the opposite surface 228 of the circuit board 212, preferably at least partially aligned with or overlapping the footprint or area occupied by the ASIC 218. Although it is possible to provide for mounting the termination board 226 by any of a plurality of mounting methods, including adhesion or soldering, in one embodiment, the termination board 226 is provided with an array of solder balls 232a,b,c, preferably at least some of which are aligned with the vias 214a,b,c. The ASIC pins 216a,b,c (or conductive material in the vias 214a,b,c) make electrical contact with pads on the termination board 226 which in turn are used to provide a connection to termination resistances which can be formed as printed resistors 234a, buried resistors 234b, or surface mount resistors 234c. In this way, it is possible to position the terminating resistor 234a, 234b, 234c a distance 236 which does not substantially exceed the sum of the thickness of the circuit board 238 plus the thickness 242 of the termination board.

Termination boards according to embodiments of the present invention can be provided in any of a number of different shapes or sizes. It is possible to provide a termination board which is substantially similar in size and shape to the footprint of the ASIC 412. It is not uncommon, however, for an ASIC to provide only some pins (e.g., about 60% of total ASIC pins) which need termination and, in many configurations, some or all of the pins require in termination are positioned in a discrete area of the footprint such as one-half of the footprint. In these situations, the termination board may be sized and shaped 414 to cover substantially only that portion of the ASIC footprint 412 which contains the pins which are to be terminated (or which are be terminated using the termination board 414). Limiting the size and shape of the termination board can assist in reducing costs.

In some situations, it may be desired to provide a signal path or connection from the termination board to a component of the main board which is positioned outside the footprint 412 of the ASIC. In some such situations, the termination board 514 may be configured to extend into a region 516 outside the ASIC footprint 412, e.g., to provide for connection to a component 518. The signal connection to the component 518 can be used either in connection with providing a signal to a portion of the termination board 514 (or a component thereon) or can be used to provide a signal or connection to an ASIC pin.

In one embodiment, in order to fabricate the device, an ASIC with a ball grid array is aligned on the first surface of a circuit board with at least some pins or solder balls of the ASIC aligned with circuit board vias. A, preferably multilayer, termination board is positioned at least partially aligned with or overlapping a portion of the footprint defined by the ASIC, preferably with a ball grid array also aligned with circuit board vias. In one embodiment, the entire assembly is heated and both the ASIC and the termination board are substantially simultaneously mounted to the circuit board.

In light of the above description, a number of advantages of the present invention can be seen. The present invention can assist in improving signal quality by increasing the locality of termination (i.e., decreasing the distance from ASIC pins to termination resistors). Increasing locality can assist in reducing signal distortions, reflections, and EMI, e.g., associated with stubs. The maximum distance between the termination and the desired pin can be reduced to the sum of the thicknesses of the main circuit board plus the thickness of the termination board or, in some embodiments, can be reduced to substantially the thickness of the main circuit board alone. The present invention can provide a cost saving over conventional approaches. The fabrication complexity of the main circuit board can be reduced, as well as the complexity of board layout (since the present invention can assist in reducing the number of connections required between the ASIC and external terminating resistors). Cost reductions can also arise from reducing the number of placed surface mount resistors.

Figure 6:
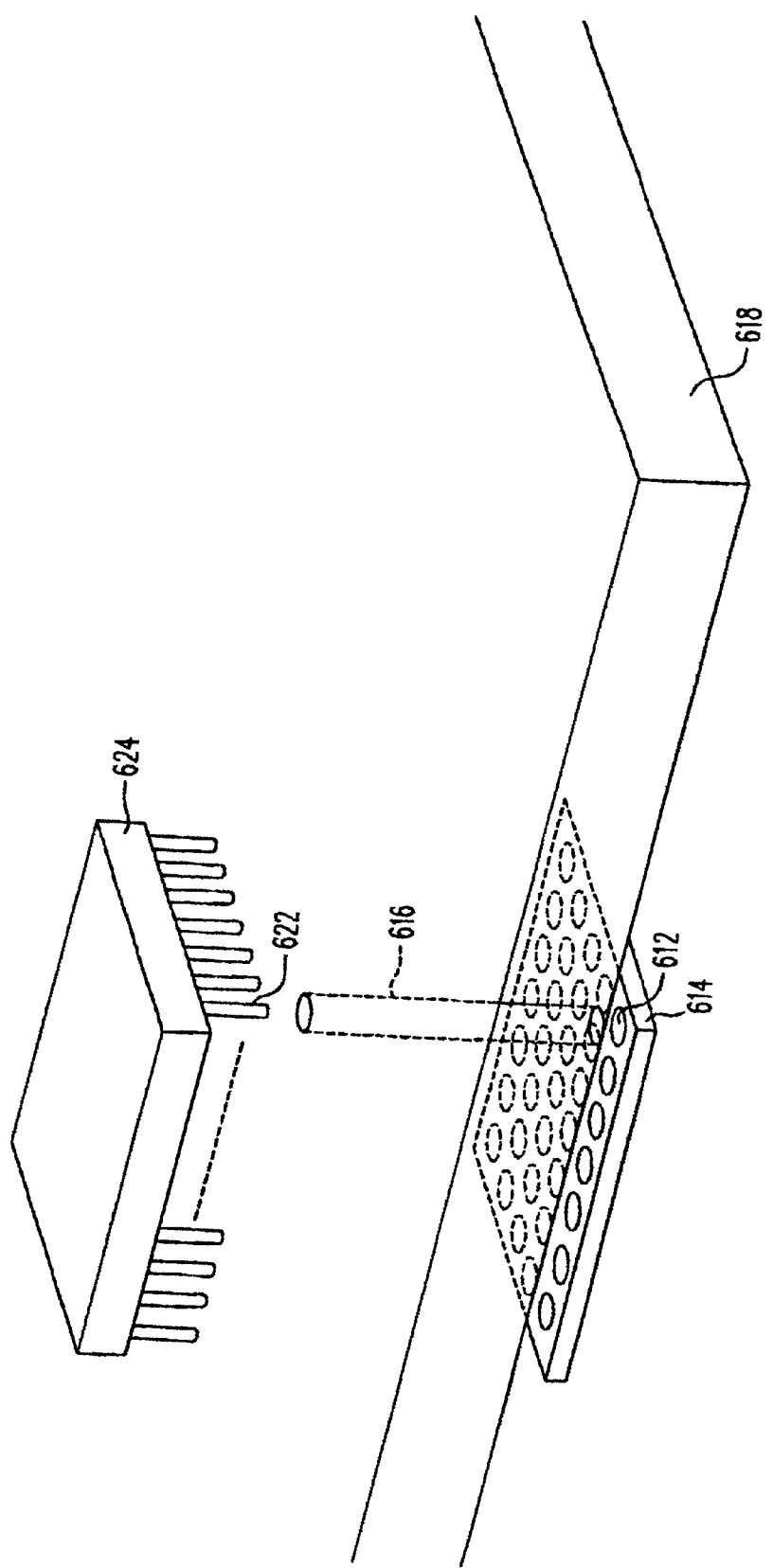
FIG. 6 is a perspective exploded view of an embodiment of the present invention used with a column grid array ASIC.

FIG. 6 illustrates another embodiment of the present invention in which some or all balls of a termination board ball grid array 614 are aligned with vias 616 of the main PCP 618 which receives columns 622 of a column grid array ASIC 624.

A number of variations and modifications of the invention can be used. Although the present invention has been described in connection with providing terminations for pins of an ASIC, the present invention can be used in connection with any type of device which may require terminations, including microprocessors, programmable gate arrays (PGAs), and the like. Although the present invention is believed to be particularly useful for high (clock) frequency devices, it is also possible to use some features of the present invention in connection with lower frequency devices. It is possible to use some features of the invention without using others. For example, it is possible to use a termination board without providing a connection to a component outside the ASIC footprint. Although embodiments have been described in which both the ASIC and the termination board are coupled to the circuit board using a ball grid array, it is also possible to provide embodiments in which either or both of the ASIC and termination board are coupled using other coupling approaches (such as adhesion or soldering). Although the present invention can be used to provide termination for ASIC pins using a termination board, it is possible to use a termination board only in connection with some pins of an ASIC and to provide conventional (or other) termination for other pins of the ASIC. Although the termination board has been described in connection with providing termination resistances, it is possible to use embodiments of the present invention for providing other types of connections to selected pins such as capacitance, inductance, and/or signal paths.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and/or reducing cost of implementation. The present invention includes items which are novel, and terminology adapted from previous and/or analogous technologies, for convenience in describing novel items or processes, do not necessarily retain all aspects of conventional usage of such terminology.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. Apparatus for providing termination for at least a first pin or a multi-pin component to be mounted in a footprint area of a first surface of a first circuit board, comprising:
    a second circuit board mounted on a second surface of said first circuit board;
    at least a first conductive pathway from said first surface of said first circuit board to said second surface of said first circuit board to provide access for said at least a first pin of said multi-pin component to at least a first location of said second circuit board; and at least a second conductive pathway, formed at least partially through said second circuit board, from said first location of said second circuit board to at least a first resistance, wherein said at least a first resistance is associated with said second circuit board.

2. Apparatus, as claimed in claim 1, wherein said multi-pin component comprises an ASIC.

3. Apparatus, as claimed in claim 1, wherein said at least a first resistance is positioned on a surface of said second circuit board.

4. Apparatus, as claimed in claim 1, wherein said at least a first resistance is positioned in an interior region of said second circuit board.

5. Apparatus, as claimed in claim 1, wherein said at least a first resistance is selected from among a surface mount resistor, a printed resistance and a buried resistance.

6. Apparatus, as claimed in claim 1, wherein at least a portion of said at least a first conductive pathway comprises a via including a conductive material formed in said first circuit board.

7. Apparatus, as claimed in claim 1, wherein said second circuit board is wholly aligned within at least a portion of the region defined by said footprint.

8. Apparatus, as claimed in claim 1, wherein a first portion of said second circuit board is positioned within the region defined by said footprint and a second portion of said second circuit board is positioned within a region outside said footprint.

9. Apparatus, as claimed in claim 8, wherein said second portion of said second circuit board provides at least a portion of a third conductive pathway to a location of said first circuit board outside said footprint.

10. Apparatus, as claimed in claim 1, wherein said first pin carries a signal having a frequency greater than about 1 gigahertz.

11. Apparatus, as claimed in claim 1, wherein each of said first and second circuit boards has a thickness and wherein said at least a first conductive pathway and said at least a second conductive pathway have a combined length which is less than the sum of the thickness of said first and second circuit boards.

12. Apparatus, as claimed in claim 1, wherein said second circuit board is coupled to said first circuit board by a ball grid array.

13. Apparatus, as claimed in claim 1, wherein said multi-pin component and said second circuit board are coupled to said main circuit board substantially simultaneously.

* * * * *